United States Patent
Godet et al.

(10) Patent No.: US 8,728,951 B2
(45) Date of Patent: May 20, 2014

(54) METHOD AND SYSTEM FOR ION-ASSISTED PROCESSING

(75) Inventors: Ludovic Godet, Boston, MA (US);
Xianfeng Lu, Beverly, MA (US);
Deepak A. Ramappa, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/563,056

(22) Filed: Jul. 31, 2012

(65) Prior Publication Data

US 2014/0038393 A1    Feb. 6, 2014

(51) Int. Cl.
*H01L 21/31*    (2006.01)
*H01L 21/469*    (2006.01)

(52) U.S. Cl.
USPC ............. 438/758; 118/723 R; 257/E21.16; 257/E21.169; 257/E21.269; 257/E21.274; 438/485; 438/497; 438/503; 438/507; 438/584; 438/680; 438/770; 438/771; 438/775; 438/777; 438/792

(58) Field of Classification Search
USPC ............. 118/723 R; 257/E21.16, E21.169, 257/E21.269, E21.274; 438/485, 497, 503, 438/507, 584, 680, 758, 770, 771, 775, 777, 438/792

See application file for complete search history.

(56) References Cited

U.S. PATENT DOCUMENTS

| | | | |
|---|---|---|---|
| 6,001,420 A | 12/1999 | Mosely et al. | |
| 6,225,627 B1 | 5/2001 | Koyama | |
| 6,300,628 B1 | 10/2001 | Fujii et al. | |
| 6,924,004 B2 | 8/2005 | Rao et al. | |
| 7,528,394 B2 | 5/2009 | Matsuba | |
| 7,667,209 B2 | 2/2010 | Kaga | |
| 2004/0115364 A1* | 6/2004 | Grosse et al. | 427/569 |
| 2004/0159552 A1 | 8/2004 | Khan et al. | |
| 2006/0045987 A1 | 3/2006 | Chandler et al. | |
| 2008/0245304 A1* | 10/2008 | Yonker et al. | 118/725 |
| 2009/0246412 A1 | 10/2009 | Knowles et al. | |
| 2009/0317934 A1 | 12/2009 | Scherff et al. | |
| 2010/0255665 A1* | 10/2010 | Godet et al. | 438/513 |
| 2010/0258524 A1 | 10/2010 | Remiat et al. | |

* cited by examiner

*Primary Examiner* — Asok K Sarkar

(57) ABSTRACT

A method of processing a substrate includes performing a first exposure that comprises generating a plasma containing reactive gas ions in a plasma chamber and generating a bias voltage between the substrate and the plasma chamber. The method also includes providing a plasma sheath modifier having an aperture disposed between the plasma and substrate and operable to direct the reactive gas ions toward the substrate, and establishing a pressure differential between the plasma chamber and substrate region while the reactive gas ions are directed onto the substrate.

15 Claims, 10 Drawing Sheets

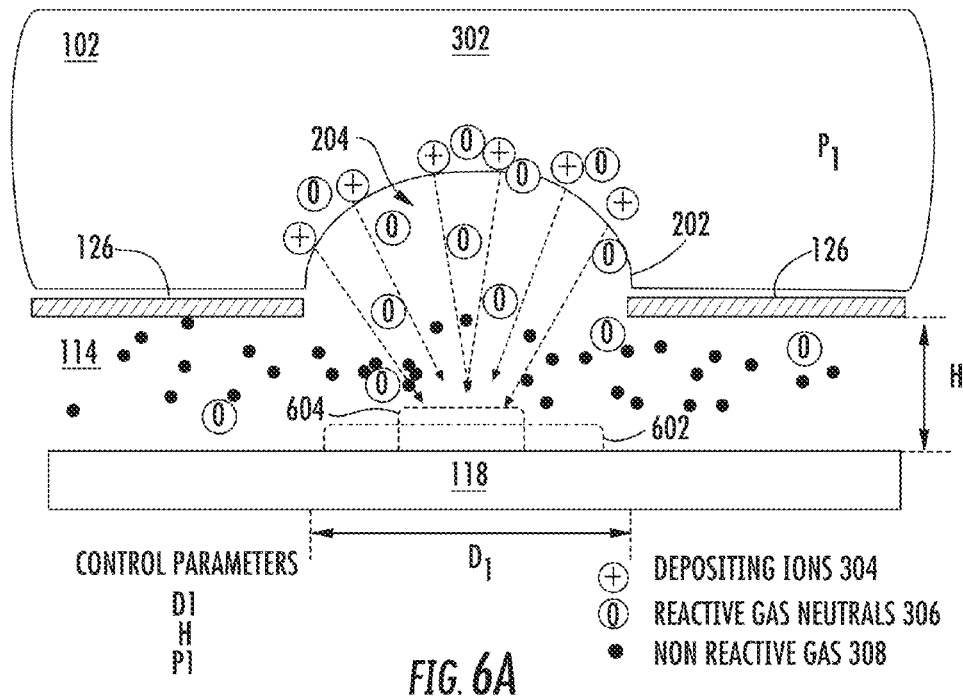
FIG. 6A
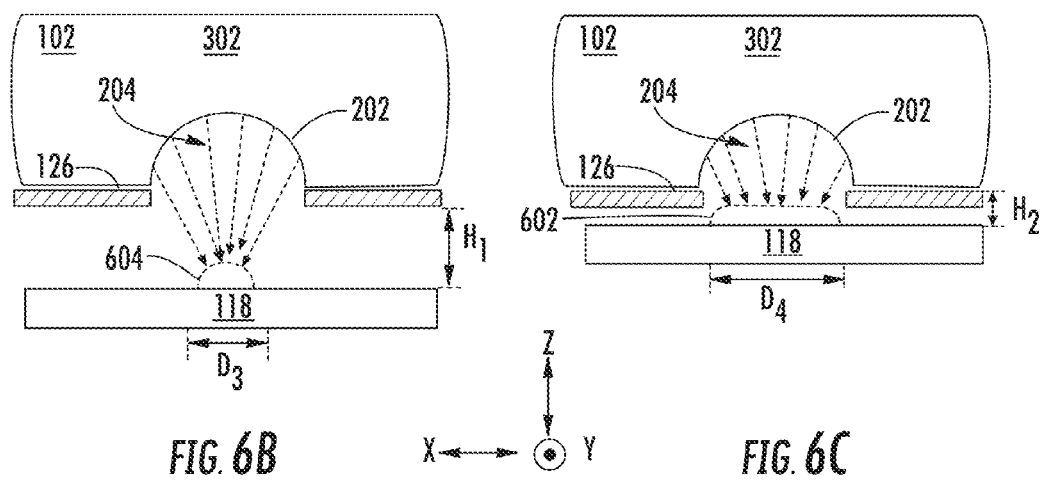
FIG. 6B
FIG. 6C

METHOD AND SYSTEM FOR ION-ASSISTED PROCESSING

BACKGROUND OF THE INVENTION

1. Field of the Invention

Embodiments of the invention relate to the field of device processing. More particularly, the present invention relates to a method, system and structure for patterning a substrate.

2. Discussion of Related Art

Patterned deposition of material is used for device fabrication in a wide range of technologies and industries. Similarly, patterned etching of substrates is used to form many different types of device structures. Such processes typically may involve a number of individual steps and may entail use of multiple types of fabrication tools, adding to the complexity and expense of device manufacture. For example, currently patterned deposition techniques are employed for fabricating such components as semiconductor circuits and discrete devices, micro-electrical mechanical devices (MEMS); solar cell devices, electronic sensors, transducers, memory devices, magnetic devices, and other devices. To achieve patterned deposition, each of such applications may require complicated masking process, lithography tools, and etching tools, requiring multiple steps-steps, which leads to high production cost. Similarly, patterned etching or doping of a substrate may entail deposition of a sacrificial material, lithographic processing to define a pattern to be etched or doped, which may involve the use of multiple masks and masking steps, and one or more etching or implantation steps to define a permanent pattern in the substrate.

In view of the above, it will be appreciated that there is a need to develop less complex and costly methods for patterning substrates to form patterned deposition on the substrate or patterned etching of the substrate.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Embodiments of the present disclosure are directed to methods and systems for improving patterning a substrate, in particular, by providing local deposition or local etching on a substrate in order to provide a corresponding pattern of deposited material or etched portions in the substrate. In one embodiment, a method of processing a substrate comprises performing a first exposure that comprises generating a plasma containing reactive gas ions in a plasma chamber, generating a bias voltage between the substrate and the plasma chamber, providing a plasma sheath modifier having an aperture disposed between the plasma and substrate and operable to direct the reactive gas ions toward the substrate, and establishing a pressure differential between the plasma chamber and substrate region while the reactive gas ions are directed onto the substrate.

In another embodiment, a system for processing a substrate comprises a plasma chamber for establishing a plasma including reactive gas ions, a bias supply to supply a bias between the plasma chamber and the substrate, a plasma sheath modifier disposed between the plasma chamber and substrate, the plasma sheath modifier having an aperture operable to direct the reactive ions toward the substrate in a beam having an ion beam profile, and a process chamber enclosing the substrate and operable to provide a pressure differential between the plasma chamber and process chamber.

BRIEF DESCRIPTION OF THE DRAWINGS

FIGS. 6a-6f present a schematic depiction of varying the deposit width of a deposited material during ion-assisted localized deposition in a processing system consistent with the present embodiments.

FIG. 10b depicts a two dimensional film thickness profile of a portion of the deposit of FIG. 10a.

DESCRIPTION OF EMBODIMENTS

Figure 1:
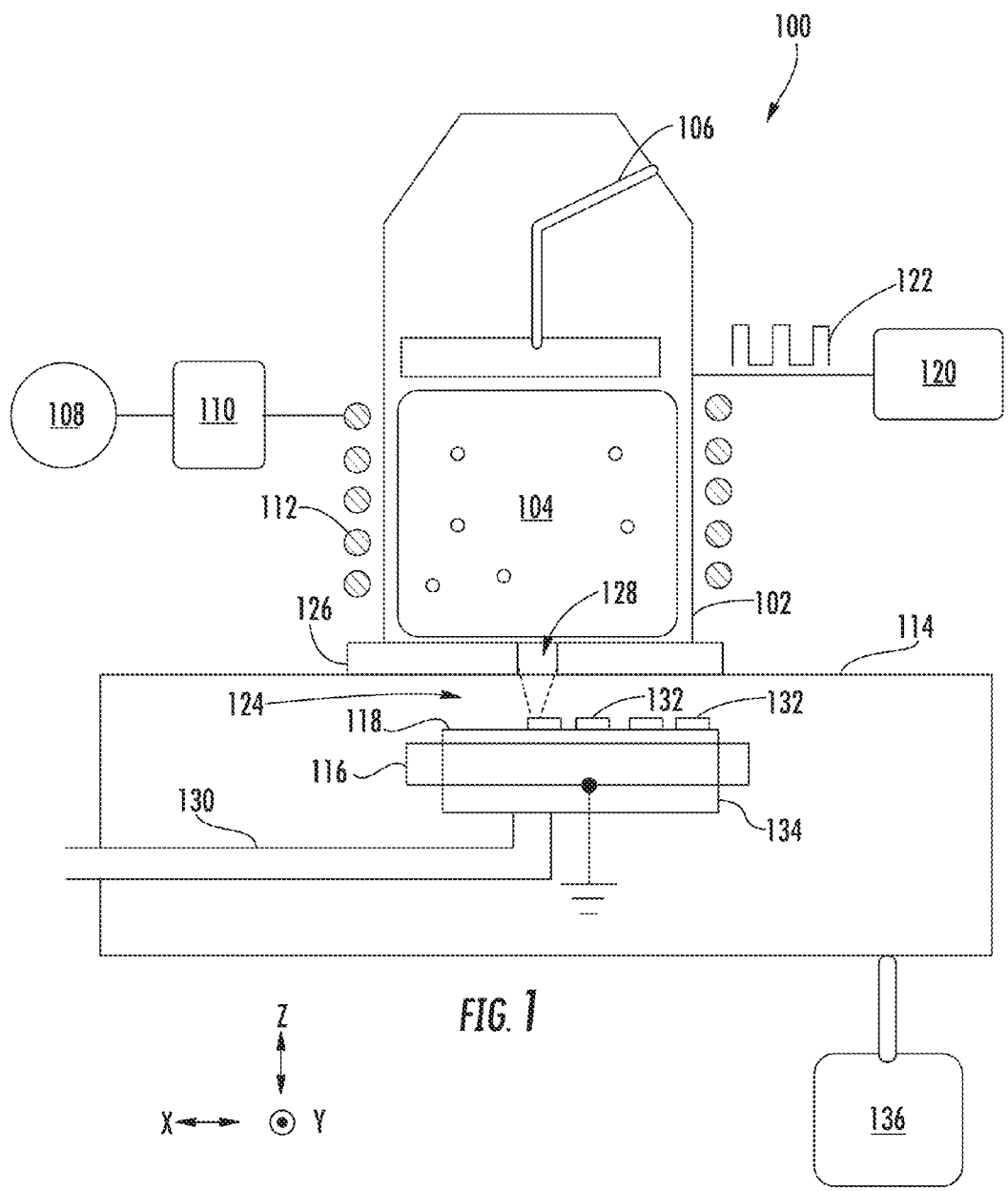
FIG. 1 is a schematic depiction of an exemplary processing system consistent with the present embodiments.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

In present day fabrication of devices, many deposition and etching processes may involve the use of plasma and/or ion beam tools to produce ions and other gaseous species to be employed in processing the substrate. In a typical plasma tool used for processing substrates, a portion of gaseous species form ions while another portion of gaseous species are neutral species. In order to reduce the aforementioned complexity of patterned deposition/patterned etching, it may be desirable to use such plasma tools for selective processing of substrates, in which plasma species can be used to selectively deposit or selectively etch in desired regions of the substrate. This may require the ability to control the amount and/or position of the desired species at a given location. However, conventional plasma tools do not provide independent control of ions and neutral species incident on a substrate. This makes it very difficult to localize the deposition/etch region, since neutral species are uncontrollable by application of electric or magnetic fields, and may impinge uniformly on a substrate. Thus, even if depositing ions can be directed to select regions of a substrate, when such neutrals also deposit onto the substrate, the positional deposition selectivity, that is, the localization, provided by a beam of depositing ions may be reduced or completely eliminated by unwanted deposition by neutrals. Similarly, in etching processes where both ions and neutrals may act as etchants, the inability to control the position of neutrals on a substrate may reduce or eliminate the ability to etch only select regions of a substrate using directed ions.

To solve these deficiencies, the present embodiments provide novel and inventive approaches to selective processing, including ion-assisted selective deposition and/or selective etching of desired regions of a substrate as opposed to undesired regions of the substrate. For clarity, the process of spatially selectively depositing a material or performing etching in a desired region of a substrate is termed "localized deposition" or "localized etching." These techniques may be referred to more generally as "localized processing," or "localized plasma processing," which may cover either localized deposition, localized etching, or localized ion implantation. More specifically, the present embodiments provide what is referred to herein as "ion-assisted localized plasma processing" or simply "ion-assisted localized processing" to denote that ions derived from a plasma are used to perform the localized processing. Moreover, it is to be noted that the localized processing disclosed herein may generally be performed without masking.

In various embodiments, an ion-assisted localized deposition technique is employed to fabricate patterned structures in a substrate. In some embodiments, ion-assisted selective localized may be used to selectively place on a substrate a coating or portions of a coating, such as an insulator, semiconductor, polymer, or metallic layer. Among other benefits that accrue to this technique are the ability to fabricate structures and devices while eliminating at least some of the complex lithographic processing, conventionally employed to pattern a substrate. In addition to eliminating lithographic patterning steps, the etching, cleaning, and related processes can be avoided, which may substantially impact manufacturing complexity, throughput, and cost. In some embodiments, the ion-assisted localized deposition is used to provide patterned doping of a substrate. In addition, the present embodiments may be applied to improve three dimensional (3D) deposition, 3D doping, 3D etching, or 3D precision material modification.

In order to achieve localized processing of a substrate, the present embodiments entail directing a narrow or small cross-sectional area ion beam onto a substrate in selected regions to be deposited upon, etched, and/or implanted. Processing systems and techniques are provided to enhance the selectivity of the localized processing, that is, the ability to direct localized processing only in the desired local area (region) of the substrate without incurring unwanted processing in other areas of the substrate.

FIG. 1 depicts an exemplary processing system 100 for performing ion-assisted localized processing. The processing system 100 includes a plasma chamber 102 in which a plasma 104 may be generated. A gas source 106 provides a source of gas that may be supplied to plasma chamber 102 to provide a source of gaseous species to form a plasma. A plasma source for the plasma 104 may, in various embodiments, be an in situ or remote, inductively coupled plasma source, capacitively coupled plasma source, helicon source, microwave source, or any other type of plasma source. In the specific embodiment depicted in FIG. 1, a radio frequency (RF) generator 108 is coupled to a matching network 110 to provide an RF signal to coils 112. The RF signal in coils 112 may generate a radiofrequency plasma in plasma chamber 102, which plasma may be used to process a substrate as detailed below.

Processing system 100 also includes a process chamber 114 adjacent to and communicating with plasma chamber 102. The process chamber 114 includes a substrate holder 116, which may support a substrate 118 to be processed by ions derived from the plasma chamber 102. In various embodiments, the substrate holder 116 is movable with respect to the plasma chamber 102. In some embodiments, the substrate holder 116 may be movable along multiple different directions. For example, the substrate holder 116 may be movable along one or more of an X-direction, Y-direction, and Z-direction, which may be mutually orthogonal to one another as defined in the coordinate system of FIG. 1. This allows different portions of the substrate 118 to be exposed to ions that exit the plasma chamber 102 and enter the process chamber 114.

In order to direct ions to the substrate 118, a bias may be applied between the substrate holder 116 and plasma chamber 102. In various embodiments, a continuous or pulsed bias having a desired voltage appropriate for a given process may be applied between the substrate holder 116 and plasma chamber 102. In the example shown in FIG. 1, a bias source 120 may apply a pulsed bias signal 122 to the plasma chamber 102 while the substrate holder 116 is grounded. However, in other embodiments, a pulsed or continuous (negative) bias may be applied to the substrate holder 116, while the plasma chamber 102 is grounded. In the example shown in FIG. 1, the pulsed bias signal 122 may comprise pulses of positive voltage alternating with periods where zero voltage is applied, resulting in (positive) ions 124 being directed toward the grounded substrate holder 116 during periods of positive voltage pulses. The ions 124 may impinge upon select regions of the substrate 118 resulting in deposition, etching, and/or implantation in those select regions.

The processing system 100 includes a plasma sheath modifier (PSM) 126 adjacent to a portion of the plasma chamber 102 that is proximate the process chamber 114. In some embodiments, the PSM 126 may define a portion of the plasma chamber, a portion of the process chamber, or both. Consistent with the present embodiments, the PSM defines one or more apertures 128 that are used to direct the ions 124 to selected regions of the substrate 118. Although only illustrated in cross-section in the FIG. 1, in plan view (x-y plane), the aperture 128 may assume any desired shape, such as a narrow slit, an oval, a circle, or a combination of shapes, to name a few examples. The PSM 126 may be multiple individual parts, or may be a single plate, for example. The PSM 126 acts to cause a local perturbation in the edge of a plasma sheath of plasma 104, as illustrated in more detail in FIG. 2, for example. By doing so, the shape of plasma sheath proximate the aperture can be controlled in a manner that causes ions 124 to exit the plasma 104 and impinge on the substrate 118 over a range of angles. In some embodiments, the ions 124 may impinge upon the substrate 118 in a narrowing beam as illustrated. Additional description of general features of a processing system with a PSM can be found in co-pending U.S. patent application Ser. No.: 12/417,929, filed Apr. 3, 2009, and issued as U.S. Pat. No. 7,767,977; Ser. No. 12/418, 120, filed Apr. 3, 2010; Ser. No. 12/644,103, filed Dec. 22, 2009; and Ser. No. 12/848,354, filed Aug. 2, 2010, each of which is herein incorporated in its entirety by reference.

As further illustrated in FIG. 1, the drive 130 may be engaged to move the substrate holder 116 along the X-direction, while the substrate 118 is exposed to ions 124 from the plasma 104. As depicted, along the X-direction, the size of aperture 128 is smaller than the size of substrate 118, and the ions 124 form a narrowing beam, resulting in exposure at any given instant of only a local region of the substrate 118 having a small dimension along the X-direction. Accordingly, processing of the substrate 118 may be confined to a narrow region along the X-direction at a given time. By translating the substrate holder 116 along the X-direction, multiple regions of the substrate 118 may be exposed to local processing. In order to avoid processing of unwanted regions of substrate 118 by ions 124, the pulsed bias signal 122 may be extinguished when those unwanted regions are scanned under the aperture 128. In the example of FIG. 1, multiple localized deposits 132 may be formed on the substrate 118. These deposits may be formed by supplying ions 124 that are reactive species condensable on the substrate 118 under the appropriate experimental conditions, as detailed below. However, in other examples, multiple localized etched regions may be formed in an analogous manner. The processing system 100 also may include a substrate heater 134, and one or more pumping system, such as pump system 136, whose operation is described further below.

Figure 2:
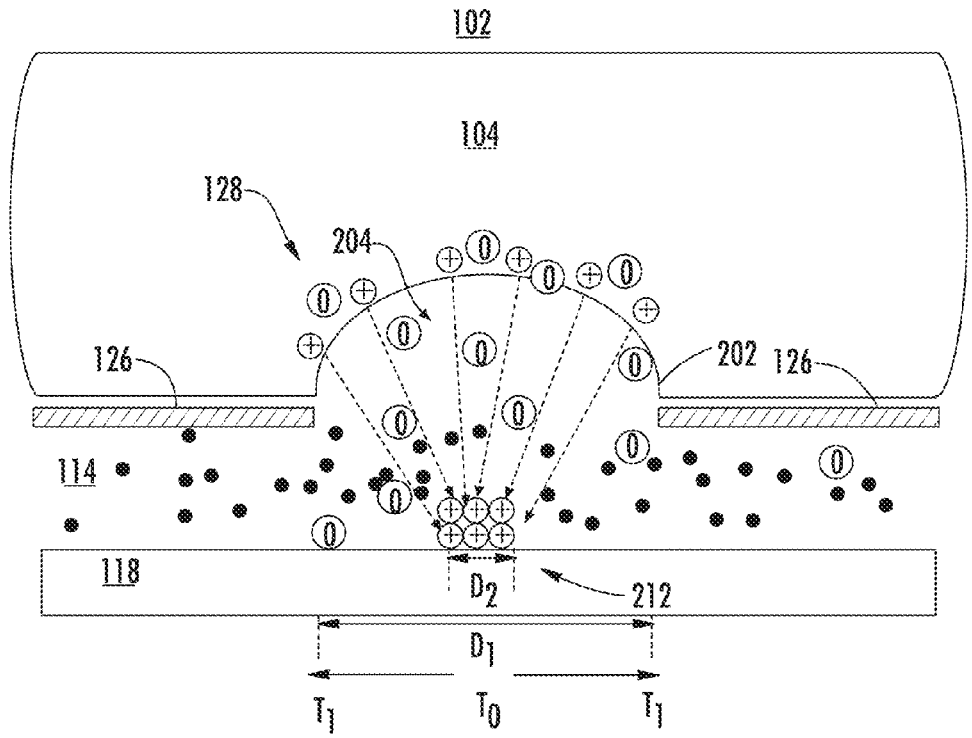
FIG. 2 depicts details of ion-assisted localized processing consistent with the present embodiments.

FIG. 2 depicts details of ion-assisted localized processing consistent with the present embodiments. The plasma 104 depicted in FIG. 2 may be generated in the chamber 102, as illustrated. The plasma 104 may include species such as positive ions, electrons, negative ions, and neutral species, among others. At the edge of the plasma 104, a plasma sheath 204 forms that includes a plasma sheath boundary 202. A portion of the plasma sheath boundary 202 adjacent the aperture 128 may form a curved shape as shown. The modified plasma sheath boundary 202 therefore is non-parallel to the plane defined by substrate 118. When ions in the plasma 104 reach an edge of the plasma defined by the plasma sheath boundary 202, the ions may accelerate across the plasma sheath 204 and strike the substrate with 118 with an energy determined by the difference in the plasma potential $V_p$ of plasma 104 and the potential of the substrate 118 $V_s$. Moreover, the ions may accelerate towards the substrate over a range of angles due to the curvature of the plasma sheath boundary 202 in the region above aperture 128.

In various embodiments, the ions of plasma 104 are reactive gas ions 206, which may be used to deposit material on the substrate 118 or etch material from the substrate 118. The term "reactive gas ions" as used herein, refers to ions that are operable to undergo a chemical reaction to condense on a substrate to form a deposit, or are operable to react with the substrate to remove substrate material, so as to etch the substrate. An example of a plasma containing reactive gas ions is a silane ($SiH_4$) based plasma, which may include other species, such as halogen species ($Cl_2$, $SiCl_2H_2$, etc.), other hydrogen-containing species, as well as inert species such as noble gas ions or neutrals. Depending on the exact composition of such a plasma, and factors such as ion energy, a silane-based plasma may be used to perform deposition of silicon material on a substrate or etching of the silicon substrate. Other examples of reactive gas ions include boron-containing compounds, such as diborane, which may be used to form a deposit of boron according to the present embodiments. Still other examples of reactive gas ions include combinations of different ions, such as silane and diborane, which may be employed to deposit a boron-doped silicon layer as an example.

As illustrated in FIG. 2, the reactive gas ions 206 may form a converging beam such that the ions extracted from the plasma sheath boundary 202 impinge upon substrate 118 in a bombardment region 212 whose width $D_2$ is smaller than the aperture width $D_1$ of aperture 128. In this manner, processes such as ion-assisted deposition onto- or etching into substrate 118 may be localized to a region whose width is smaller than the width of aperture 128. In some embodiments, the aperture width $D_1$ may be as small as about 1 mm, and the width $D_2$ of the bombardment region 212 may be as small as 100 μm. Thus, localized processing of the substrate 118 by the reactive gas ions 206 may take place in regions having widths of about 100 μm or greater.

As further illustrated in FIG. 2, the plasma 104 may provide neutral reactive gas species, or reactive gas neutrals 208. In some cases, these neutral species may include species that are neutrally charged species that are related to the reactive gas ions 206. For example, a diborane gas ($B_2H_6$) may be supplied to a plasma chamber to deposit a boron-containing material. Some molecules in the $B_2H_6$ gas may be ionized to form boron-containing ions, while other molecules form reactive boron-containing neutrals. In some cases, the reactive gas neutrals 208 and reactive gas ions 206 may react similarly with the substrate 118. Accordingly, in order to localize processing of the substrate 118 to the bombardment region 212, the present embodiments provide techniques and apparatus to enhance reactive ion/substrate interactions over reactive neutral/substrate interactions.

As also shown in FIG. 2, non-reactive gas 210 may be supplied in the process chamber 114. The non-reactive gas 210 may provide enhancement to the ion-assisted localized processing, as detailed below.

Figure 3:
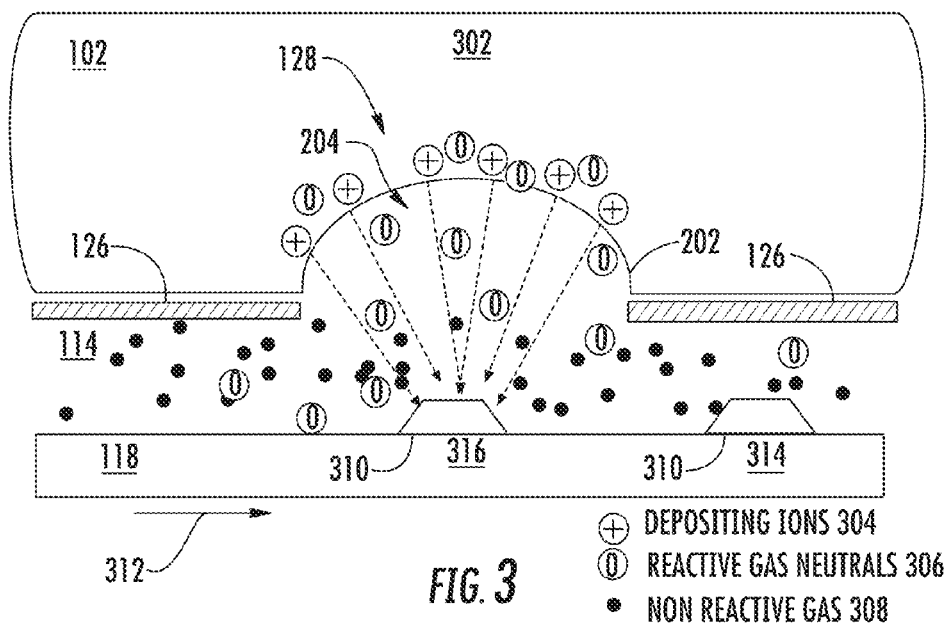
FIG. 3 depicts details of ion-assisted localized deposition consistent with the present embodiments.

FIG. 3 depicts details of ion-assisted localized deposition consistent with the present embodiments. In the example shown, a plasma 302 is generated in the plasma chamber 102. The plasma 302 may include reactive ions that deposit on substrate 118. In the example shown, the depositing ions 304 are directed in a converging beam of ions to impact the substrate 118. For clarity, the depositing ions 304 near the substrate surface are omitted, with only ion trajectories illustrated. When the depositing ions 304 impact the substrate 118, the depositing ions may condense and adhere to the substrate 118, thereby forming a deposit 310. In various embodiments, the depositing ions 304 may be an ion formed from any known molecular or atomic species used to deposit materials including elemental semiconductors, compound semiconductors, oxides, nitrides, carbides, silicides, ternary compounds, elementals, metal compounds, metal alloys, polymeric materials, or composite materials, among others. Furthermore, in various embodiments, the depositing ions 304 may include multiple different ion species that each condense to form the material to be deposited.

In addition to the depositing ions 304, reactive gas neutrals 306 may be generated in the plasma chamber 102, and may impinge on the substrate 118. The reactive gas neutrals 306 may include gaseous species related to the depositing ions 304, including gaseous precursor molecules from which the depositing ions 304 form, and active molecular radicals (or "free radicals") derived from such gaseous precursor species.

In the example illustrated in FIG. 3, the substrate 118 is scanned along the direction 312, so that multiple, separated deposits 310 may be formed. The separate deposits 310 may be formed by positioning the substrate 118 at a first position and providing a bias between the plasma 104 and substrate 118 sufficient to attract depositing ions 304 to condense in a first region 314 of the substrate 118. The bias may subsequently be removed and the substrate 118 scanned so that second region 316 is proximate the aperture 128. A bias may be re-applied between the plasma 104 and substrate 118 sufficient to attract depositing ions 304 to condense in a second region 316 of the substrate 118. In this manner, the substrate 118 may be patterned with a series of narrow (in the X-direction) deposits, such as narrow semiconductor, oxide, or metal lines, without the use of a mask.

Moreover, it has been observed that varying the power applied to plasma 302 may be used to change the shape of the plasma sheath boundary 202, and thereby the focus of the beam of depositing ions 304. Thus, consistent with the present embodiments, the relative size of the deposits 310 along the direction 312 may be modified by changing power applied to plasma 302.

Because the reactive gas neutrals 306 may also condense upon the substrate 118 to form a deposit, the reactive gas neutrals 306 may limit the localization of a deposit. For example, as illustrated in FIG. 3, the reactive gas neutrals 306 may exit the plasma chamber 102 through aperture 128 and impinge upon the substrate at various regions. Because the reactive gas neutrals 306 are not influenced by an electric field created by the potential between plasma 104 and substrate 118, the reactive gas neutrals 306 may impinge on a wider region of the substrate 118 as compared to the depositing ions 304, which are focused into a converging beam in the example of FIG. 3. Therefore, deposition resulting from the condensing reactive gas neutrals 306 may occur in unwanted areas, such as those areas between deposits 310.

Figure 4:
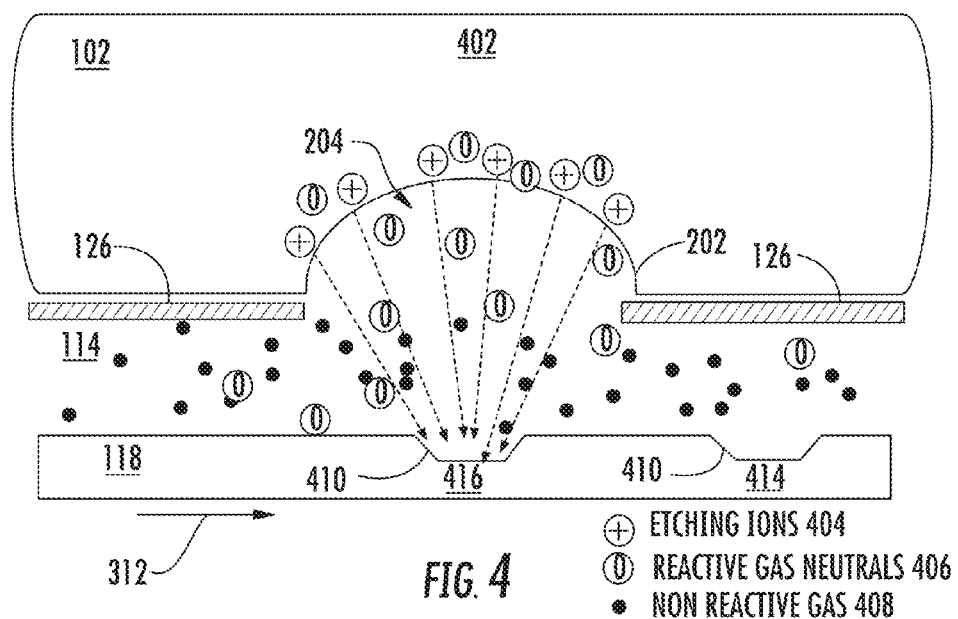
FIG. 4 depicts details of ion-assisted localized etching consistent with the present embodiments.

FIG. 4 depicts details of ion-assisted localized etching consistent with the present embodiments. Instead of depositing ions, the plasma 402 of FIG. 4 generates etching ions 404, which etch the substrate 118 at regions impacted by the etching ions 404. Such etching ions 404 may include any of known species used to etch substrates, including etchants for silicon, silicon oxide, silicon nitride, or metallic surfaces. The etching ions 404 may be focused to define narrow etched features 410 in regions 414, 416 in a manner similar to that described for forming the deposits 310. The plasma 402 may also generate reactive gas neutrals 406, which may also perform etching of the substrate 118. In addition, non-reactive gas 408 may be provided, for example, in the process chamber 114. Since the reactive gas neutrals 406 may not be confined to the regions 414, 416, etching by reactive gas neutrals 406 may take in unwanted areas between regions 414, 416. Additionally, consistent with further embodiments, the relative size of the etched features 410 along the direction 312 may be modified by changing power applied to plasma 402.

In view of the examples of FIGS. 3 and 4, it is advantageous to minimize the relative effect of impingement of the reactive gas neutrals 306 as compared to the depositing ions 304. It is therefore also advantageous to minimize the relative effect of impingement of the reactive gas neutrals 406 as compared to the etching ions 404. Consistent with the present embodiments, this may be accomplished in various approaches, as discussed further below.

Figure 5:
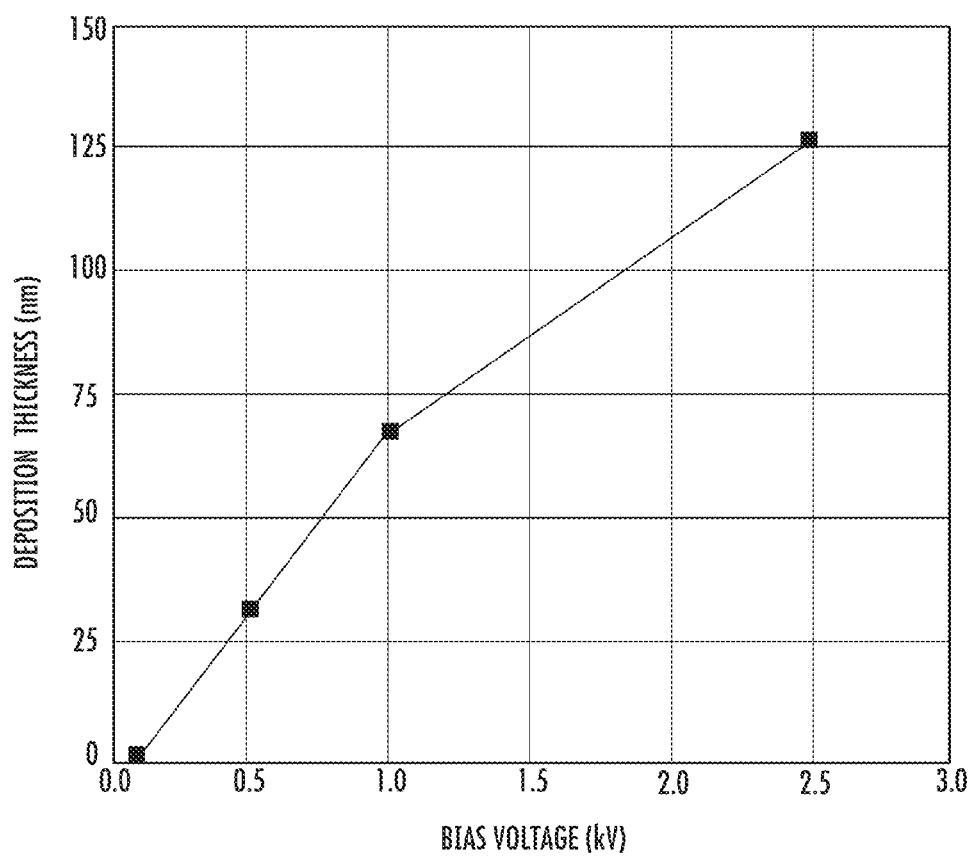
FIG. 5 is a graph that depicts deposition thickness (rate) as a function of substrate bias according to one embodiment.

In one example, the localization of deposits produced by ion-assisted localized deposition may be enhanced by controlling the bias applied between plasma and substrate. For example, a higher bias may induce a more rapid deposition of impinging ions because of increased sticking coefficient resulting at higher ion energies, and other effects. FIG. 5 is a graph that depicts deposition thickness (which is equivalent to deposition rate for a fixed deposition time) as a function of bias between plasma and substrate. As shown, the deposition rate rapidly rises as a function of increasing bias. Accordingly, a higher bias between substrate and plasma may be applied in order to increase deposition rate of a localized deposit. Because reactive neutrals are not influenced by an increase in bias, their relative impingement rate on a substrate may be unaffected by increase in bias. Accordingly, in the present embodiments increased substrate bias may be employed to increase the relative deposition rate of a deposit formed by depositing ions, as opposed to deposits formed from depositing reactive neutrals. Turning once more to FIG. 3, it can be seen that the deposits 310 are formed from depositing ions focused into a narrow area defined by regions 314, 316, for example. By increasing the deposition rate to form the deposits 310, less time is required to attain a desired deposit thickness, resulting in less dose of reactive gas neutrals 306 on the substrate 118 during the deposition time, and thereby reducing the amount, if any, of unwanted deposit outside the regions 314, 316.

Consistent with various embodiments, the bias between substrate and plasma may be varied with time during ion-assisted localized deposition. For example, although increased bias may increase localization of a deposit to a desired location, excessive bias may induce ion energies sufficient to damage a substrate. Accordingly, in some embodiments, during initial stages of deposition, a bias of less magnitude is applied until the deposit thickness reaches a value in which the substrate is protected from damage from higher energy ions to an acceptable degree, at which point, the bias may be increased to more rapidly deposit the desired material so that localization is enhanced.

Consistent with further embodiments, ion-assisted localized deposition may be further optimized by control of additional parameters. In one example, as the separation of substrate and PSM is varied along a Z-direction to control the focusing of ions, which in turn may vary the width of a deposit. In another example, the pressure in a plasma chamber is varied in order to control focusing of ions. Varying the pressure may vary the plasma sheath dimensions, which may alter curvature of the plasma sheath boundary adjacent an aperture in the PSM. The altered curvature may then produce an altered distribution of angles of ions accelerated across the sheath.

Figure 6D:
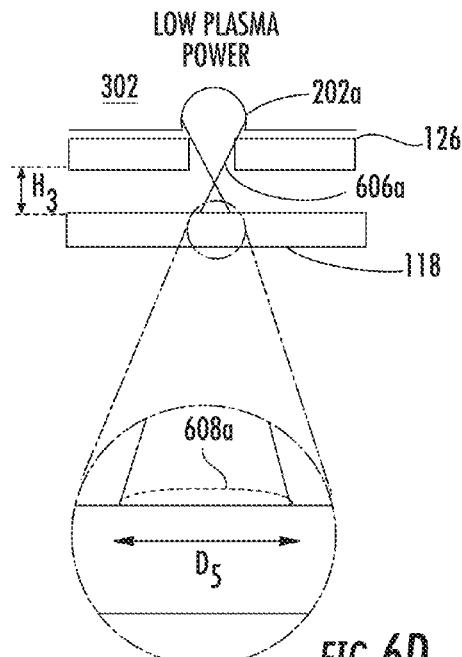

FIGS. 6a-6f are schematic depictions of varying deposit width of a deposited material by varying control parameters in a processing system consistent with the present embodiments. FIG. 6a exhibits two different deposits 602, 604 having two different widths that may be produced by varying such control parameters. As depicted in FIG. 6a, control parameters that may influence focusing of ions and thereby the deposit width include the pressure in the plasma chamber P1, the aforementioned power applied to plasma 302, the aperture width $D_1$ and the aforementioned separation of substrate and PSM along a Z-direction (H). Referring also to FIG. 1, for a given aperture width $D_1$ the focusing of ions and therefore deposit width may be varied in a convenient fashion by moving a drive, such as the drive 130 illustrated in FIG. 1, along the Z-direction.

FIG. 6b illustrates a scenario in which the value of H ($H_1$) is relatively greater, resulting in a relatively narrower deposit, deposit 604 having a width $D_3$ that is smaller than the aperture width $D_1$ of the PSM 126. In some embodiments, by optimizing $H_1$, among other parameters, the ratio of $D_1$ to $D_3$ may be increased to as large a values as 10:1. FIG. 6c illustrates a scenario in which the value of H ($H_2$) is relatively lesser, resulting in a relatively wider deposit, deposit 602 having a width $D_4$ that is comparable to the aperture width $D_1$ of the PSM 126.

Figure 6E:
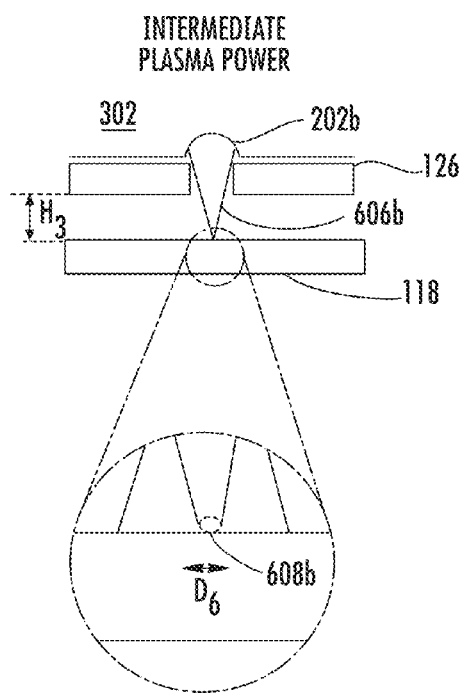
Figure 6F:
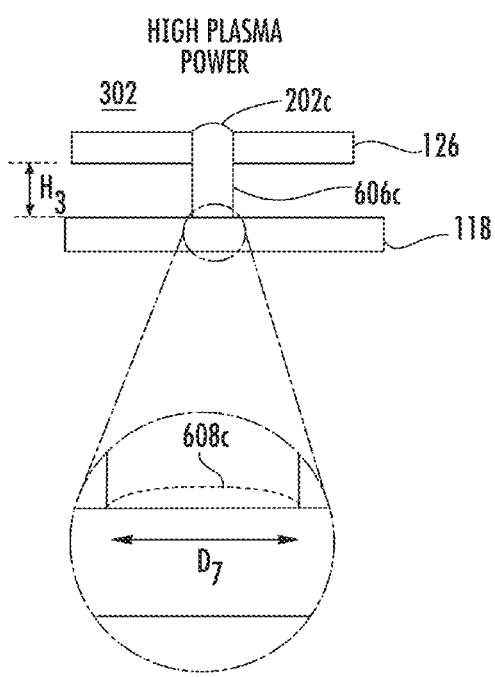

Consistent with further embodiments, FIGS. 6d-f depict control of beam width and beam shape (also termed "ion beam profile"), and therefore deposit width. This may be accomplished, for example, by varying the plasma power in the plasma 302, between a plasma power level 1, 2 and 3, while maintaining a constant value of H ($H_3$) as illustrated. For example, power supplied by the RF generator 108 (see FIG. 1) to plasma 302 may be varied to control the shape of the plasma sheath boundary. As illustrated, the ion beam profiles 606a, 606b, and 606c, may result from plasma sheath boundaries 202a, 202b, 202c, which may correspond to low, intermediate, and high plasma power levels. In the low plasma power arrangement depicted at FIG. 6d, the ion beam profile 606a has the shape of an initially converging beam in which the ions converge rapidly to a focal point above the substrate 118, and form a diverging beam proximate the substrate 118. A deposit 608a is formed having a width $D_5$ at substrate 118. When plasma power is increased, the ions may form a beam that converges less rapidly or even forms a parallel beam. In the intermediate plasma power level arrangement depicted at FIG. 6e, the convergence of the ion beam profile 606b is more gradual than in FIG. 6d, such that the "focus plane" (not separately shown) of the ions is about at the level of substrate 118. In this manner, the deposit 608b defined by ions in ion beam profile 606b is much narrower, having a width $D_6$. Finally, at the higher power arrangement, high plasma power, the rate of convergence of ions is still less or may be zero, resulting in a parallel beam. As illustrated in FIG. 6f, a very gradual convergence produces an ion beam profile 606c that is nearly parallel, resulting in a deposit 608c that has a width $D_7$ that is much larger than W2. It is to be noted that the size of the deposit width may be controlled by varying a combination of plasma power and H. For example, using the power level 2 setting depicted in FIG. 6e, the value of H may be increased so as to place the separation of substrate 118 and PSM 126 beyond the focal plane for converging ions, thereby creating a diverging ion beam profile at the substrate 118.

Figure 7A:
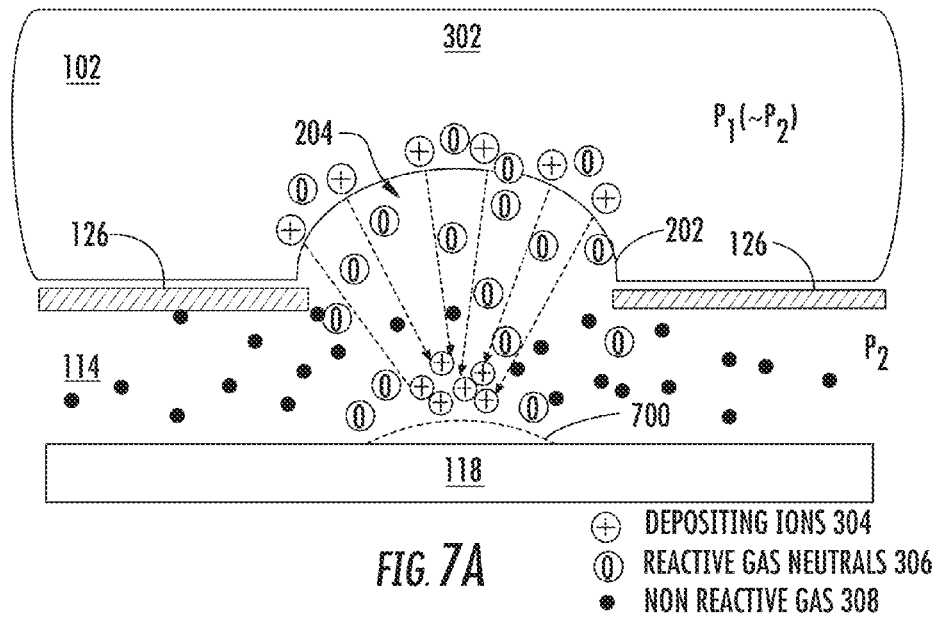
FIG. 7a is a schematic depiction of a processing system consistent with the present embodiments, in which plasma chamber pressure is comparable to the process chamber pressure.

In further embodiments, the abruptness of a deposit may be adjusted by adjusting additional parameters. To increase abruptness, for example, a pressure differential may be established between a plasma chamber and process chamber. FIG. 7a depicts a process consistent with the present embodiments, in which the pressure $P_2$ of the process chamber 114 is comparable to the pressure $P_1$ of the plasma chamber 102. For example, $P_1$ and $P_2$ may be within a factor of 5-10 of one another. In the embodiment of FIG. 7a, a local deposit 700 is formed by a converging beam of deposing ions 304. However, in addition to the depositing ions 304, reactive gas neutrals 306 may deposit on the substrate 118, leading to a more gradual profile, since the reactive gas neutrals, which emerge from the plasma chamber in a non-focused manner, are not concentrated in the region of the depositing ions.

Figure 7B:
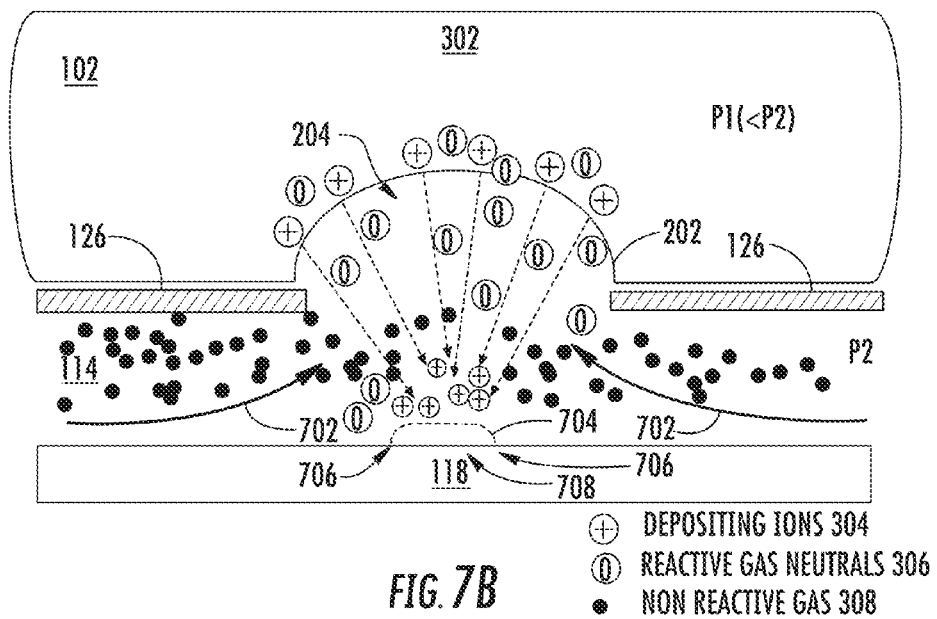
FIG. 7b is a schematic depiction of a processing system consistent with the present embodiments, in which plasma chamber pressure is less than process chamber pressure.

In order to address this issue, FIG. 7b depicts a process consistent with the present embodiments, in which the pressure $P_2$ of the process chamber 114 is higher than the pressure $P_1$ of the plasma chamber 102. This pressure differential may be established by providing a flow of non-reactive gas 308, such as an inert gas, into the process chamber 114 to establish a pressure $P_2$. The non-reactive gas may stream along directions 702 from the higher pressure chamber, process chamber 114, toward the lower pressure chamber, that is, plasma chamber 102. In so doing, the non-reactive gas 308 may effectively screen reactive gas neutrals 306 from impinging on the substrate 118. On the other hand, the depositing ions 304, which may attain energies as high as thousands of eV depending on the applied bias, are less effectively screened by non-reactive gas 308, and form a focused beam as illustrated. The net effect is that a focused beam of depositing ions 304 reaches the substrate 118, leading to a deposit 704 only in desired regions, which may result in a more abrupt deposit profile, as illustrated.

To further optimize the deposit profile, in various embodiments, the angular distribution of the depositing ions 304 may be modified. For example, although a degree of focusing of ions 304 may be desirable to create a more narrow width for deposit 704, it may be desirable to reduce the relative number of ions 304 that form a glancing angle of incidence with respect to the substrate 118, with respect to those ions that form higher angles of incidence, such as zero to forty five degrees with respect to a perpendicular to a surface of substrate 118. This may reduce the amount of deposit formed on outer regions 706 of the deposit 704 as opposed to in more central regions 708, which may lead to a more abrupt profile. As noted previously, the angular distribution of ions, such as depositing ions 304, may be modified by modifying the shape of the plasma sheath boundary 202. Accordingly, changes in plasma power applied to plasma 302 may be employed to modify the abruptness of a deposit profile.

Figure 8:
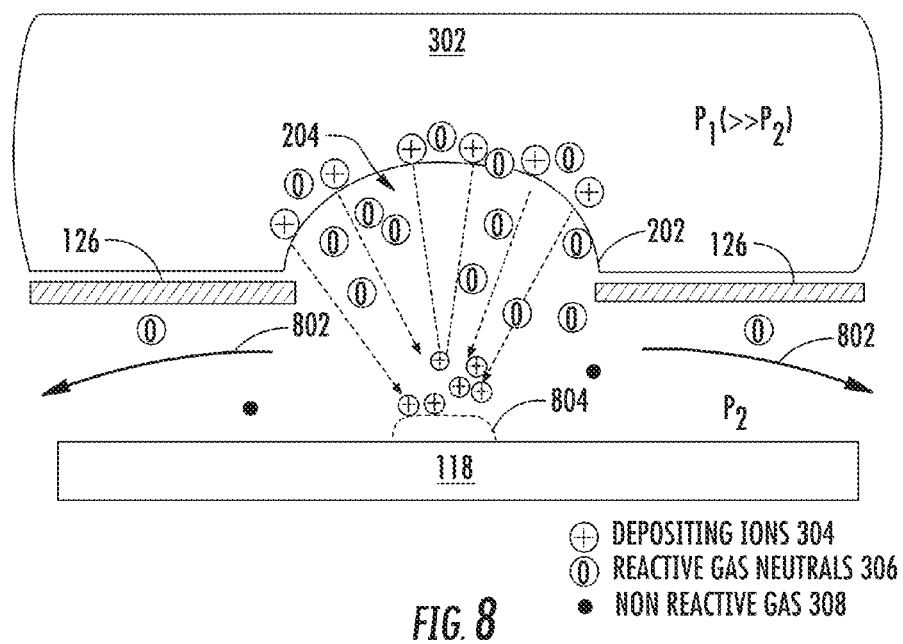
FIG. 8 is a schematic depiction of a processing system consistent with the present embodiments, in which plasma chamber pressure is greater than process chamber pressure.

FIG. 8 depicts an alternative process consistent with further embodiments, in which the pressure $P_2$ of the process chamber 114 (shown in FIG. 1) is lower than the pressure $P_1$ of the plasma chamber 102 (also shown in FIG. 1). In the scenario of FIG. 8, the pressure in process chamber 114 may be maintained in a high vacuum range, for example, less than about $10^{-5}$ Torr, while the plasma chamber 102 pressure may range from $10^{-4}$ Torr to about $2 \times 10^{-1}$ Torr as an example. In this case, a pump, such as pump system 136 illustrated in FIG. 1, may be activated to evacuate any gaseous species streaming into the process chamber 114 from plasma chamber 102. Accordingly, reactive gas neutrals 306 are pumped out of process chamber 114 along directions 802 before striking substrate 118. On the other hand, the depositing ions 304 are from a focused beam as illustrated, and attain sufficient energy so as to not be affected by the action of the pump. The net effect again is to produce result a deposit 804 having a more abrupt deposit profile, since ions are directed to a desired region for deposition without the presence of unwanted depositing species reaching other regions of the substrate 118.

Referring again to FIG. 2, in additional embodiments, a temperature gradient may be established on the substrate 118 while reactive gas ions are directed to the substrate. The temperature gradient may be such that a temperature $T_0$ is established in the central region of the substrate where reactive gas ions 206 deposit on the substrate 118. A temperature $T_1$ for substrate regions outside of the central region may be set to a temperature where the condensation rate of the reactive gas ions 206 and/or reactive gas neutrals 208 is less than at temperature $T_0$. This approach may be employed for numerous materials systems in which a temperature dependence of growth exists, including the deposition of diamond or diamond-like deposits. In this manner, a deposit having a sharper deposition profile may be produced by reducing the likelihood that any extraneous reactive gas species attach to the substrate 118 outside of a desired region of the substrate where the temperature is set to $T_0$.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

Figure 9:
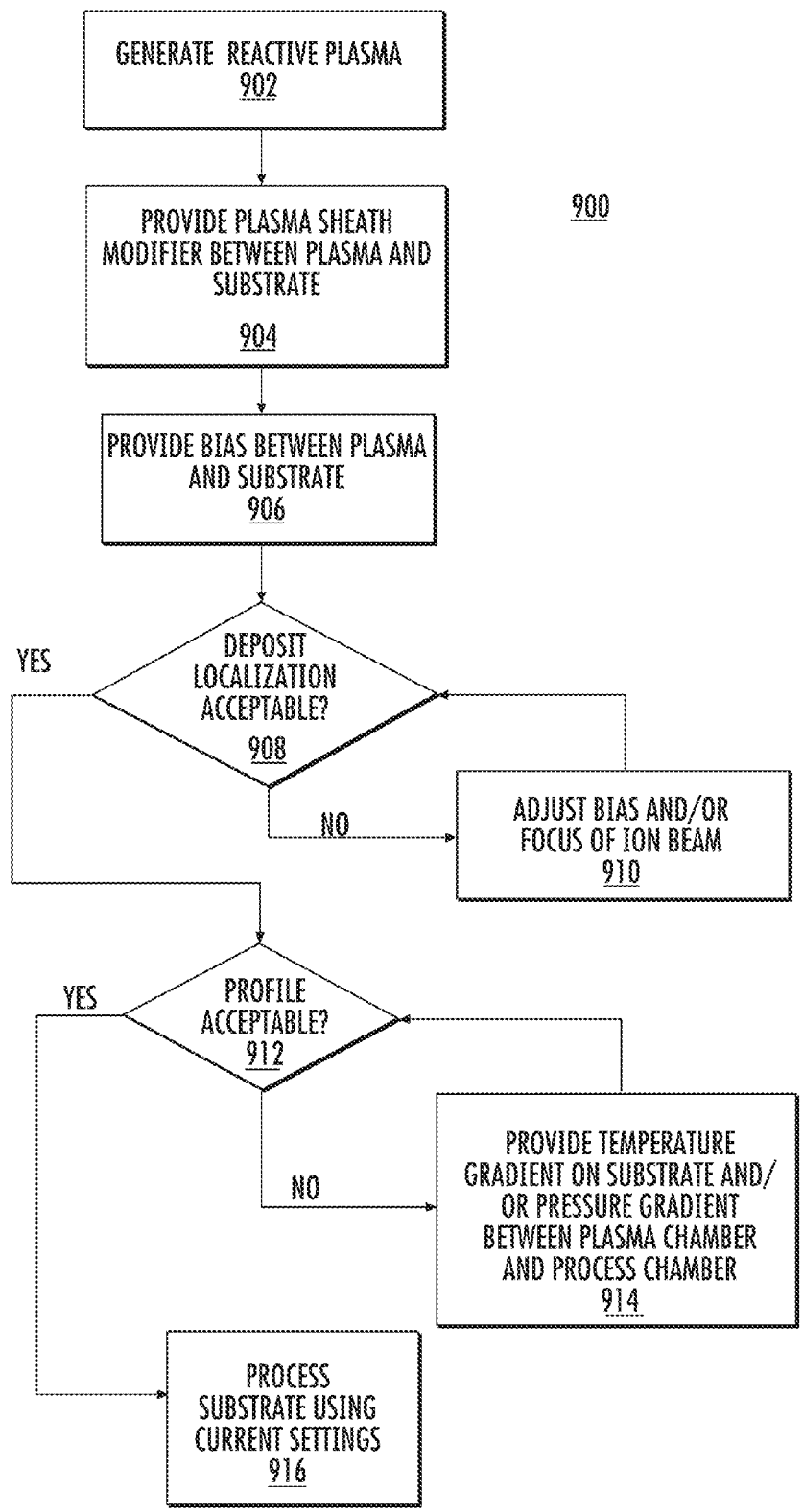
FIG. 9 depicts a process flow consistent with the present embodiments.

FIG. 9 presents one exemplary process flow 900 consistent with the present embodiments. At block 902, reactive plasma having reactive ions is generated. These reactive ions are operable to condense on a substrate. At block 904 a PSM is provided between the reactive plasma and substrate, in which the PSM contains at least one aperture. At block 906, a bias is provided between the plasma and a substrate. When the bias is applied a convergent beam of reactive ions may exit the plasma through the aperture and deposit on the substrate. At block 908, a determination is made as to whether the deposit localization is sufficient. The deposit localization may be characterized by the degree to which deposit only occurs in the region of the substrate intercepted by the beam of convergent ions. If, at block 908, the deposit localization is not sufficient, the flow moves to block 910. At block 910, the bias applied between the substrate and plasma chamber is adjusted, which may increase relatively flux of reactive ions to reactive neutrals at the substrate. Alternatively, or in addition, the focus or size of the ion beam as it intercepts the substrate may be adjusted. This size or focus may be adjusted by adjusting aperture-substrate separation, for example. The flow then returns to block 908. If, at block 908, the deposit localization is acceptable, the flow moves to block 912. At block 912, a determination is made as to whether the profile of the deposit is acceptable. For example, if a sharp profile where the deposit has steep sidewalls is desired, a gradually sloping sidewall may be deemed unacceptable. If the profile is unacceptable the flow moves to block 914. At block 914, a temperature gradient may be applied to the substrate to provide a temperature more favorable for deposition of the reacting ions in the desired region of the substrate, such as in that region where the ion beam intercepts the substrate. Alternatively, or in addition, a pressure gradient is established between the process chamber and plasma chamber as detailed above. The flow then returns to block 912. If, at block 912, the profile is acceptable, the flow moves to block 916 where the substrate(s) is processed according to current settings.

Figure 10A:
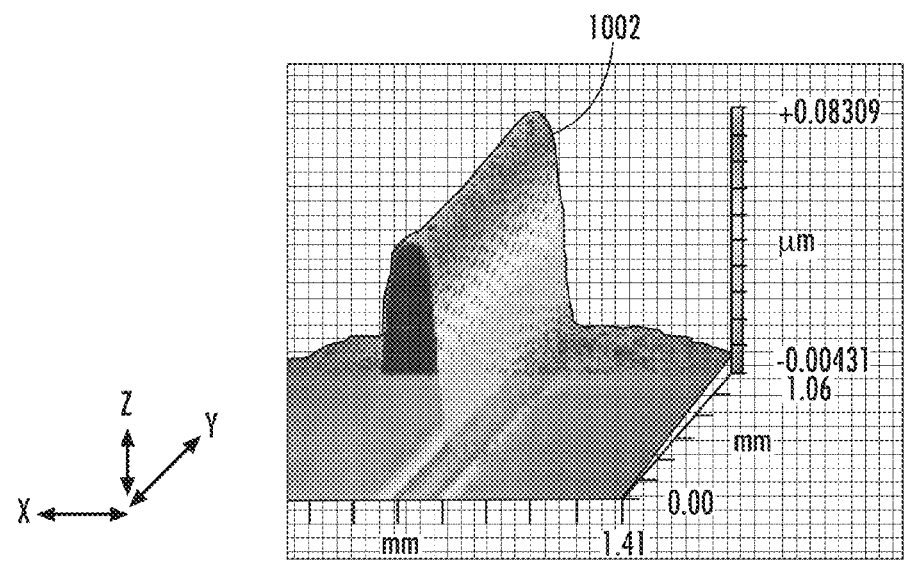
FIG. 10a depicts a three dimensional film thickness profile determined by optical profilometry of a deposit produced by ion-assisted localized deposition consistent with the present embodiments.

FIG. 10a depicts a three dimensional thickness profile 1002 determined by optical profilometry of a deposit produced by ion-assisted localized deposition consistent with the present embodiments. The deposit is produced using an exemplary processing system that includes a PSM 1006 having a narrow aperture 1008, as illustrated in FIG. 10c. The deposit formed by the narrow aperture 1008 has the form of a stripe that mimics the shape of the narrow aperture 1008 whose aperture width $D_a$ is about 2 mm. Notably, the axes of FIG. 10a differ in scale and the actual deposit thickness is only about 700 nm. Thus, the three dimensional thickness profile 1002 is relatively long in one dimension that is parallel to the long dimension L (and parallel to the Y-axis of the coordinate system shown) of the narrow aperture 1008, and is relatively short in the perpendicular to the long dimension (and parallel to the X-axis), reflecting the narrow aperture width $D_a$.

Figure 10B:
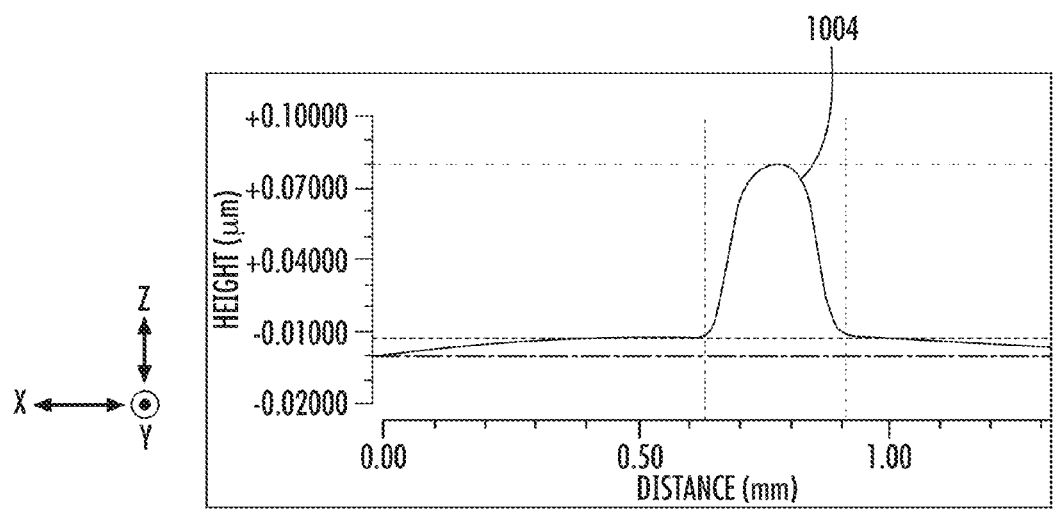
Figure 10C:
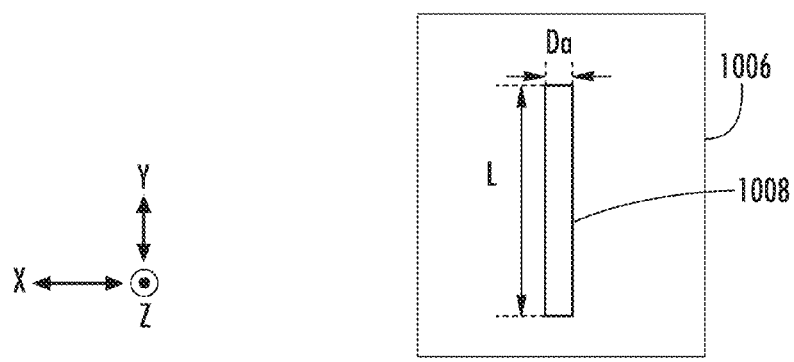
FIG. 10c depicts a plan view of an exemplary plasma sheath modifier for producing the deposit whose profiles are shown in FIGS. 10a-10b.

FIG. 10b depicts a two dimensional thickness profile of a portion of the deposit of FIG. 10a. Notably, although the aperture width is 2 mm, the two dimensional thickness profile 1004 has a full width at half maximum of only about 0.2 mm, demonstrating the ability to produce a focused beam of ions that intercept a substrate over a much narrower width as compared to the width of the aperture through which the ions are extracted. It is to be noted that the results shown in FIGS. 10a-10b are merely exemplary and the exact thickness profile may be tailored according to the procedures of the present embodiments.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, although the above discussion focuses on using localized processing to produce one or more narrow or small features in a substrate, in some embodiments localized processing may be performed in conjunction with scanning of a substrate to process a large area in a uniform manner, such as a whole substrate, whose area may be 1 m². Thus, in one particular example, a substrate may be scanned proximate a PSM that includes one or more apertures that each creates an ion beam directed onto a substrate. The scanning of the substrate with respect to the ion beam(s) may create one or more relatively larger processed areas, where the processed area(s) is larger than the area(s) of the substrate intercepted by the ion beam(s) at any one instance. Pressure differential between plasma and process chamber and/or temperature gradient across the substrate may be employed to tailor the edges of such a large processed area(s), to form a more or less sharp profile at the edge of the processed area, as described above.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of processing a substrate comprising:
generating a plasma containing reactive gas ions in a plasma chamber;
providing a plasma sheath modifier having an aperture disposed between the plasma and substrate and operable to direct the reactive gas ions toward the substrate;
generating a bias voltage between the substrate and the plasma chamber; and
establishing a pressure differential between the plasma chamber and substrate region while the reactive gas ions are directed toward the substrate,
wherein the reactive gas ions directed toward the substrate is a first substrate exposure,
the method further comprising performing an additional exposure comprising:
removing the bias voltage between the substrate and the plasma chamber after the first substrate exposure;
scanning the substrate with respect to the plasma chamber from a current position to a next position; and
re-establishing the bias voltage between the substrate and the plasma chamber.

2. The method of claim 1, the aperture defining a gap adjacent a plasma sheath boundary wherein a shape of the plasma sheath boundary about the gap is convex relative to a plane of the substrate.

3. The method of claim 1, the plasma sheath modifier operable to form a converging beam of reactive gas ions incident on a first region of the substrate when the bias voltage is applied between the plasma chamber and substrate, the aperture having a first width that is greater than a second width characteristic of the first region of the substrate.

4. The method of claim 3, further comprising adjusting a separation between the substrate and plasma sheath modifier so as to adjust a ratio of the first width to the second width.

5. The method of claim 1, the pressure differential being operable to increase a ratio of reactive gas ions to reactive gas neutrals incident on the substrate.

6. The method of claim 1, wherein the reactive gas ions include condensing ions operable to form a deposit on the substrate, the method further comprising:
providing a first bias to the substrate during a first interval; and
providing a second bias to the substrate that is greater than the first bias during a second interval subsequent to the first interval.

7. The method of claim 1, comprising providing a first gas pressure in the plasma chamber that is lower than a second gas pressure proximate the substrate.

8. The method of claim 7, comprising flowing inert gas in a process chamber that contains the substrate.

9. The method of claim 1, comprising providing a first gas pressure in the plasma chamber that is greater than a second gas pressure in a process chamber that contains the substrate.

10. The method of claim 9, comprising evacuating the process chamber so as to selectively remove reactive gas neutrals as opposed to reactive gas ions from the process chamber.

11. The method of claim 1, further comprising providing a temperature gradient in a plane of the substrate, the temperature gradient operable to generate a gradient in condensation rate of the reactive gas ions along a plane of the substrate.

12. The method of claim 1, comprising providing reactive gas ions operable to deposit a material comprising one or more of: an elemental semiconductor, a compound semiconductor, an oxide, a nitride, a carbide, a silicide, a ternary compound, an elemental metal, a metallic compound, a metallic alloy, a polymeric material, or a composite material.

13. A method of processing a substrate comprising:
generating a plasma containing reactive gas ions in a plasma chamber;
providing a plasma sheath modifier having an aperture disposed between the plasma and substrate and operable to direct the reactive gas ions toward the substrate;
generating a bias voltage between the substrate and the plasma chamber;
establishing a pressure differential between the plasma chamber and substrate region while the reactive gas ions are directed toward the substrate,
wherein the reactive gas ions include condensing ions operable to form a deposit on the substrate, the method further comprising:
providing a first bias to the substrate during a first interval; and
providing a second bias to the substrate that is greater than the first bias during a second interval subsequent to the first interval.

14. A method of processing a substrate comprising:
generating a plasma containing reactive gas ions in a plasma chamber;
providing a plasma sheath modifier having an aperture disposed between the plasma and substrate and operable to direct the reactive gas ions toward the substrate;
generating a bias voltage between the substrate and the plasma chamber;
establishing a pressure differential between the plasma chamber and substrate region while the reactive gas ions are directed toward the substrate; and
providing a first gas pressure in the plasma chamber that is lower than a second gas pressure proximate the substrate.

15. The method of claim 14, further comprising flowing inert gas in a process chamber that contains the substrate.

* * * * *